US011802336B2

(12) United States Patent
El Mansouri et al.

(10) Patent No.: US 11,802,336 B2
(45) Date of Patent: Oct. 31, 2023

(54) APPARATUS FOR FLUIDIZED-BED CHEMICAL VAPOUR DEPOSITION

(71) Applicants: SAFRAN CERAMIC, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Amine El Mansouri, Bordeaux (FR); Nathalie Dominique Bertrand, Saint-Maixant (FR); Sébastien Couthures, Villenave-d'Ornon (FR); Alain Jean-Michel Guette, Le Bouscat (FR)

(73) Assignees: SAFRAN CERAMIC, Le Haillan (FR); CENTRE NATIONAL DE LA RECHERCHE SCIENTIFIQUE, Paris (FR); UNIVERSITE DE BORDEAUX, Bordeaux (FR)

( * ) Notice: Subject to any disclaimer, the term of this patent is extended or adjusted under 35 U.S.C. 154(b) by 0 days.

(21) Appl. No.: 18/003,444

(22) PCT Filed: Jun. 21, 2021

(86) PCT No.: PCT/FR2021/051122
§ 371 (c)(1),
(2) Date: Dec. 27, 2022

(87) PCT Pub. No.: WO2022/003268
PCT Pub. Date: Jan. 6, 2022

(65) Prior Publication Data
US 2023/0193459 A1    Jun. 22, 2023

(30) Foreign Application Priority Data
Jul. 1, 2020 (FR) .................................... 2006956

(51) Int. Cl.
C23C 16/442 (2006.01)
C23C 16/26 (2006.01)
(Continued)

(52) U.S. Cl.
CPC ............ C23C 16/442 (2013.01); C23C 16/26 (2013.01); C23C 16/4411 (2013.01); C23C 16/4417 (2013.01); C23C 16/46 (2013.01)

(58) Field of Classification Search
None
See application file for complete search history.

(56) References Cited

U.S. PATENT DOCUMENTS

2003/0059615 A1    3/2003    Klinedinst et al.
2010/0047136 A1    2/2010    Kim et al.
2014/0127116 A1*   5/2014    Filtvedt ............... B01J 8/44
                                                        239/548

FOREIGN PATENT DOCUMENTS

CN    204122068 U  *  1/2015
FR    2931811 A1     12/2009
GB    1567256 A   *  5/1980   ........... C23C 16/442

OTHER PUBLICATIONS

W.O. Filtvedt et al., Development of fluidized bed reactors for silicon production, Solar Energy Materials and Solar Cells, vol. 94, Issue 12, 2010, pp. 1980-1995, (Year: 2010).*
(Continued)

*Primary Examiner* — Joel G Horning
(74) *Attorney, Agent, or Firm* — Bookoff McAndrews, PLLC (57) ABSTRACT

The present disclosure relates to an apparatus for fluidised-bed chemical vapour deposition from a gaseous phase allowing the temperature of the fluidised bed to be stabilised during the deposition and also to an associated method for its implementation, the apparatus being characterised in that it comprises a porous thermal insulator present in an inlet (Continued)

zone and configured to be passed through by the gaseous phase, said porous thermal insulator having an effective thermal conductivity at 20° C. less than or equal to 3.5 W·m-1·K-1.

9 Claims, 4 Drawing Sheets

(51) Int. Cl.
*C23C 16/44* (2006.01)
*C23C 16/46* (2006.01)

(56) References Cited

OTHER PUBLICATIONS

Zhou (Powder Technology 197 (2010) 102-110) (Year: 2010).*
Gonzo (E.E.).—Chem. Eng. J., 90, p. 299 (2002) (4 pages).
International Search Report and Written Opinion issued in International Application No. PCT/FR2021/051122 dated Oct. 8, 2021 (7 pages).

* cited by examiner

APPARATUS FOR FLUIDIZED-BED CHEMICAL VAPOUR DEPOSITION

CROSS-REFERENCE TO RELATED APPLICATION(S)

This patent application is a U.S. National Stage entry of International Application No. PCT/FR2021/051122, filed on Jun. 21, 2021, now published as WO 2022/003268 A1, which claims priority to French Application No. 2006956, filed on Jul. 1, 2020.

TECHNICAL FIELD

The present invention relates to an apparatus for fluidised-bed chemical vapour deposition allowing the temperature of the fluidised bed to be stabilised during the deposition, and the use of this apparatus.

PRIOR ART

The technique of fluidised-bed chemical vapour deposition is known per se and allows particles to be coated by various coatings suitable for the desired application.

It is however desirable to improve the yield of fluidised-bed chemical vapour deposition techniques.

DISCLOSURE OF THE INVENTION

The present invention relates to an apparatus for fluidised-bed chemical vapour deposition, comprising at least:
- a reactor comprising a treatment zone in which the fluidised-bed chemical vapour deposition is intended to be carried out from a gaseous phase, an inlet zone through which the gaseous phase is intended to be introduced into the treatment zone and an outlet zone through which the gaseous phase is intended to be removed from the treatment zone,
- a heating system configured to heat the treatment zone, and
- a cooling system configured to cool the inlet zone, the apparatus being characterised in that it further comprises a porous thermal insulator present in the inlet zone and configured to be passed through by the gaseous phase, said porous thermal insulator having an effective thermal conductivity at 20° C. less than or equal to 3.5 W·m$^{-1}$·K$^{-1}$.

In the following, for conciseness, the expression "porous thermal insulator" will be designated by "insulator".

The term "effective thermal conductivity of the insulator" shall mean the thermal conductivity of the volume occupied by the insulator, including the interstitial gas in its pores, and not the thermal conductivity of the material constituting the insulator. The interstitial gas present in the pores of the insulator reduces its effective thermal conductivity and can thus limit the dissipation of heat, during the deposition, between the treatment zone which is heated and the inlet zone which is cooled. This allows the temperature of the fluidised bed to be stabilised in the treatment zone and reduces the phenomenon of reduction of the useful zone in which the deposition is effectively carried out, thus improving the yield of the deposition.

The effective thermal conductivity of the porous thermal insulator $\lambda_{eff}$ filled with gas of thermal conductivity $\lambda_g$ can be determined by verifying the relation below:

[Math. 1]

$$\frac{\lambda_{eff}}{\lambda_g} = \frac{1 + 2\beta\phi + (2\beta^3 - 0.1\beta)\phi^2 + \phi^3 \times 0.05\exp(4.5\beta)}{(1 - \beta\phi)} \quad (9)$$

$$\text{With } \beta = \frac{\lambda_s - \lambda_g}{\lambda_s + 2\lambda_g}$$

In the above relation, $\lambda_S$ designates the thermal conductivity of the material forming the porous thermal insulator (i.e. the material of the grains in the case of an insulator in the form of a granular bed), $\phi$ designates the solid volume fraction of the porous insulator or $(1-\phi)$ designates the volume pore ratio of this porous insulator. Reference can be made to the publication GONZO (E.E.).—Chem. Eng. J., 90, p. 299 (2002).

In an exemplary embodiment, the porous thermal insulator has an effective thermal conductivity at 20° C. less than or equal to 0.42 W·m$^{-1}$·K$^{-1}$.

Such a feature helps to yet further improve the yield of the coating deposition operation.

In particular, the porous thermal insulator can have an effective thermal conductivity at 20° C. less than or equal to 0.11 W·m$^{-1}$·K$^{-1}$, for example substantially equal to 0.11 W·m$^{-1}$·K$^{-}$.

In an exemplary embodiment, the material forming the porous thermal insulator has a thermal conductivity at 20° C. less than or equal to 40 W·m$^{-1}$·K$^{-}$.

Such a feature helps to yet further improve the yield of the coating deposition operation.

In this case, the insulator is formed by a material that is itself a poor conductor of heat, which yet further stabilises the temperature of the fluidised bed during deposition of the coating. However, this case remains optional insofar as a material having a higher thermal conductivity can be used to form the insulator because the porosity of the insulator—filled with a poorly heat conducting interstitial gas—reduces the effective thermal conductivity of the insulator to an acceptable value even if the latter is formed by an intrinsically relatively heat-conducting material. In particular, the material forming the porous thermal insulator can have a thermal conductivity at 20° C. less than or equal to 4 W·m$^{-1}$·K$^{-1}$, for example less than or equal to 3 W·m$^{-1}$·K$^{-}$.

In an exemplary embodiment, the volume pore ratio of the porous thermal insulator is greater than 26%, for example greater than or equal to 32%.

Such a feature advantageously contributes to yet further reducing the effective thermal conductivity of the insulator, yet further stabilising the temperature of the fluidised bed during the deposition of the coating. In the particular case of a granular bed, such porosity values correspond to a "bulk" or non-compact filling state.

In an exemplary embodiment, the porous thermal insulator is a granular bed.

The invention also relates to a method for coating particles using an apparatus such as described above, comprising at least:
- introducing the gaseous phase into the treatment zone through the inlet zone and the porous thermal insulator,
- depositing a coating on the particles present in the fluidised-bed chemical vapour deposition treatment zone from the gaseous phase introduced, and
- recovering, after depositing of the coating, the coated particles.

In an exemplary embodiment, the gaseous phase has a thermal conductivity at 20° C. less than or equal to 0.04 $W \cdot m^{-1} \cdot K^{-}$.

In an exemplary embodiment, after the deposition of the coating, a mixture of coated particles and grains from the granular bed are recovered, and the coated particles are separated from said grains.

DESCRIPTION OF THE EMBODIMENTS

The structure of an apparatus 1 that is not according to the invention and is capable of producing a coating of particles by fluidised-bed chemical vapour deposition will be described with reference to FIG. 1. The fluidised-bed chemical vapour deposition is a known technique per se.

The apparatus 1 comprises a reactor 3 defined by a wall that can be made of quartz or of Inconel®. The reactor 3 comprises a treatment zone 31 in which the fluidised-bed chemical vapour deposition is intended to be carried out from a gaseous phase. The reactor 3 further comprises an inlet zone 35 in communication with a gaseous phase source 6 through which the gaseous phase comprising the precursor of the coating to be formed is intended to be introduced into the treatment zone 31. The inlet zone 35 comprises a porous diffuser 36 ensuring the diffusion of the gaseous phase into the reactor 3. The gaseous phase originating from the gaseous phase source 6 is introduced into the reactor 3 through the diffuser 36. The reactor 3 further comprises an outlet zone 37 through which the gaseous phase is intended to be removed from the treatment zone 31 to outside the reactor 3. The outlet zone 37 is in communication with a pumping system (not shown) in order to ensure the production of a vacuum in the reactor 3. The gaseous phase originating from the gaseous phase source 6 first passes via the inlet zone 35, then via the treatment zone 31 and is then removed to the outside of the reactor 3 by passing through the outlet zone 37. The reactor 3 may extend along a vertical axis X. The inlet 35, treatment 31 and outlet 37 zones follow one another along the axis X. The treatment zone 31 is present between the inlet zone 35 and the outlet zone 37. The bed of particles to be treated initially rests on the diffuser 36 and the gaseous phase is injected under the diffuser 36 and passes through the bed of particles from bottom to top. This upward movement of gas supports the weight of the bed of particles and ensures their fluidised state.

The apparatus 1 comprises a heating system 9 configured to heat the treatment zone 31 to a temperature that allows the formation of the coating on the particles from the precursor contained in the gaseous phase. The heating system 9 can be configured to produce resistive heating or, alternatively, inductive heating. The heating system 9 can be disposed around the entire circumference of the treatment zone 31 or around only a part thereof. Thermocouples 17 located inside a sleeve 15 centred on the reactor 3 are disposed at various positions in the reactor 3 and allow the change over time in the temperature to be monitored at various heights in the fluidised bed. The apparatus 1 further comprises a cooling system 8 configured to cool the inlet zone 35. The cooling system 8 may comprise a circuit in which a cooling fluid flows, controlled at a temperature less than or equal to 50° C., for example at 20° C. The cooling system 8 can be in the form of cooling flanges. The cooling fluid can be water. The cooling system 8 can prevent the temperature of the diffuser 36 from becoming too high in order to avoid its clogging due to a deposition produced from the gaseous phase. The heating system 9 is offset from the cooling system 8 along the axis X of the reactor 3. The heating system 9 is offset from the diffuser 36 along the axis X of the reactor 3.

The gaseous phase introduced into the reactor 3 in order to perform the coating depends on the nature of the coating to be obtained, and a person skilled in the art will use their general knowledge to select it and to select the associated deposition conditions, in terms of temperature pressure and flow rate. The gaseous phase typically comprises an inert carrier gas, such as molecular nitrogen. Gaseous precursors can be used under standard conditions, in which case they can be mixed with the carrier gas before their introduction into the reactor 3. Liquid precursors can also be used under standard conditions, in which case the carrier gas can be bubbled into the liquid precursor in order to be enriched and then be introduced into the reactor 3.

In the non-limiting example of a deposition of a pyrolytic carbon coating, molecular nitrogen can be used as carrier gas. The flow rate for introducing the carrier gas into a reactor 3 as sketched in FIG. 1, having a diameter of 5 centimetres and a height of 1 metre, can be between 500 standard cubic centimetres per minute and 3000 standard cubic centimetres per minute, for example between 750 standard cubic centimetres per minute and 1250 standard cubic centimetres per minute. The temperature imposed in the treatment zone 31 can be between 850° C. and 1100° C., for example between 925° C. and 1000° C. The heating system 9 can be positioned 15 centimetres above the diffuser 36. In this non-limiting case, it is possible to use propane as precursor of the pyrolytic carbon to be deposited. Its flow rate can be between 5% and 30% of the carrier gas flow rate, for example between 10% and 20% of the carrier gas flow rate. Examples of other precursors for pyrolytic carbon include, as gaseous precursor, methane/propane mixtures or natural gas. They can also include liquid precursors such as toluene, cyclohexane or ethanol.

Figure 1:
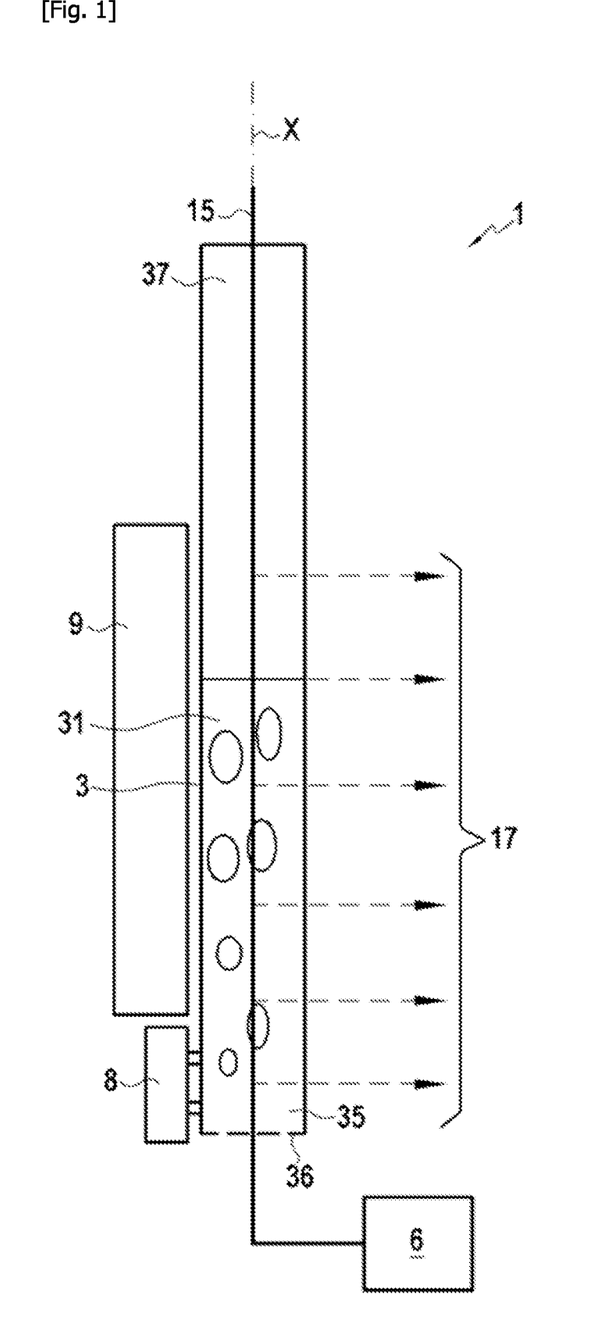
FIG. 1 schematically and partially illustrates an apparatus for implementing a fluidised-bed chemical vapour deposition not according to the invention.

The deposition carried out using the apparatus 1 of FIG. 1 gives satisfying results. Nevertheless, the inventors have observed that the average temperature of the fluidised bed drops over the course of the deposition. Indeed, maintaining a moderate temperature at the diffuser 36 in order to avoid a blockage due to a deposition coming from the gaseous phase is such that the cooled inlet zone constitutes a heat dissipation zone. The heat exchange between the wall of the reactor 3 and the fluidised bed takes place substantially by particulate convection and radiation. Thus, the fluidised bed easily releases heat to the wall of the reactor 3 in the inlet zone 35. This heat dissipation leads to a lowering of the average temperature within the fluidised bed during the deposition and to a reduction in the useful zone where the deposition is effectively carried out, which results in a drop in yield.

The experimental results obtained by the inventors which have allowed this phenomenon to be implemented are detailed below.

The inventors carried out a carbon deposition operation on a porous alumina powder having the following properties: the particles of the powder belong to Geldart groupings A or B, the diameter d50 of the particles is between 4 µm and 20 µm, the specific surface area of these particles is 200 m²/g and the initial void ratio of the fixed bed formed by these raw particles (before deposition) was equal to 80%. The carbon was deposited from propane with a setpoint temperature in the treatment zone 31 of 1000° C. and a pressure in the reactor 3 of 400 mbars. The initial mass of the particles used during the deposition was 290 grammes, corresponding to an initial height of the fluidised bed of 23.3 cm. The propane flow rate was maintained at 200 standard cubic centimetres per minute and the nitrogen flow rate at 600 standard cubic centimetres per minute.

Figure 2:
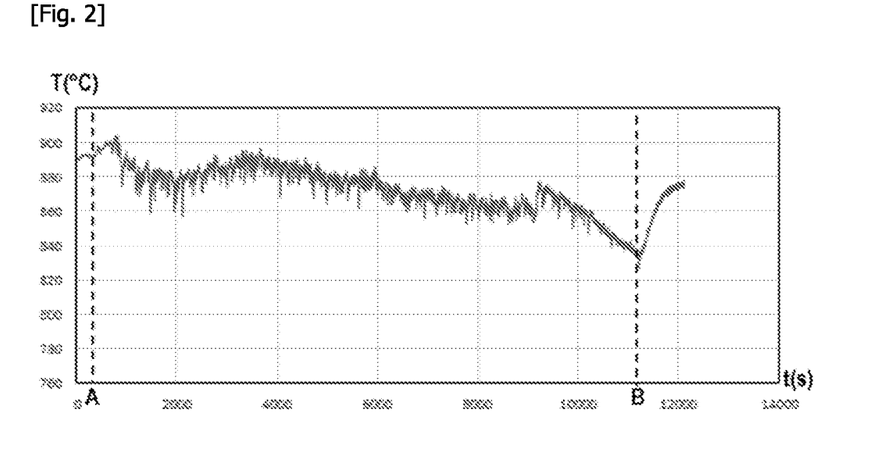
FIG. 2 shows the change over time in the average temperature of the fluidised bed during a deposition carried out using the apparatus of FIG. 1.

The change in average temperature over time of the fluidised bed during the deposition is shown in FIG. 2. In this figure, the propane injection is represented by the dashed line "A" and the end of propane injection by the dashed line "B". It is observed that the average temperature within the fluidised bed tends to drop over the course of the deposition. The active volume of the bed of particles tends to reduce, which leads to a lowering in the yield of the deposition. The inventors have observed that these thermal instabilities are accompanied by a drop in the outside temperature of the wall of the tube and an increase in the temperature of the cooling fluid circulating in the cooling system 8. Thermal monitoring also shows that after the propane is stopped, all of the thermal disturbances are attenuated and the temperature of the fluidised bed tends to increase again without, however, returning to its value before deposition.

Figure 3:
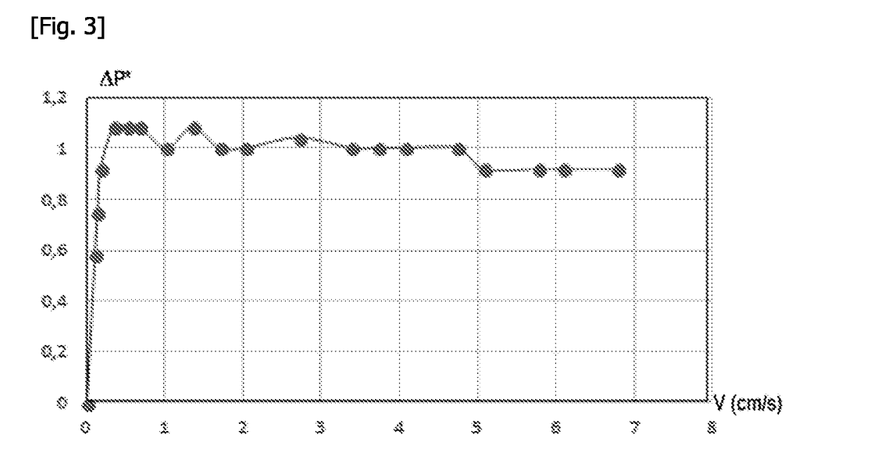
FIG. 3 shows the normalised pressure loss of the fluidisation gas as a function of its speed during the implementation of a deposition using the apparatus of FIG. 1.

FIG. 3 shows the change in the normalised pressure drop over time ($\Delta P^*$) undergone by the gas as a function of its speed.

$\Delta P^*$ is equal to the ratio between the measured pressure drop undergone by the gas passing through the fluidised bed and the theoretical value of this pressure drop. The theoretical value is calculated from the weight of the bed of particles relative to its surface area, according to the relation:

[Math. 2]

$$\Delta P^* = \frac{\Delta P_{experimental}}{\Delta P_{theroretical}} \text{ and } \Delta P_{theoretical} = \frac{m_{bed} g}{S}$$

The value of $\Delta P^*$ therefore represents a way of verifying the quality of the fluidisation regime. A value of $\Delta P^*$ equal to 1 indicates that all the particles are in a fluidised state that can be described as homogeneous.

Figure 4:
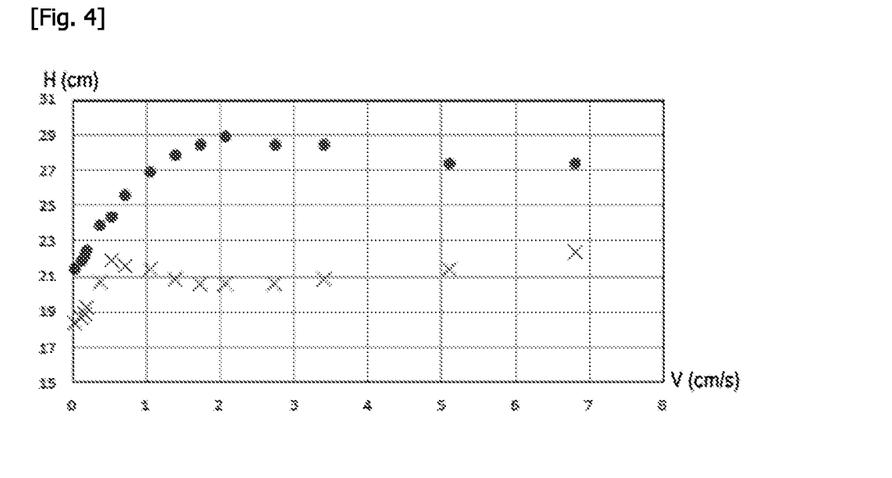
FIG. 4 compares the heights of the bed of particles obtained before and after deposition for various speeds of the fluidisation gas when the deposition of FIG. 1 is implemented.

It is observed that a value of $\Delta P^*$ close to 1 is obtained, which indicates that after deposition the powders retain an ability to fluidise homogeneously. On the other hand, a reduction in the expanded height of the powder bed after deposition was observed (see FIG. 4). The height of the powder bed at minimum fluidisation is reduced by approximately 13%. In FIG. 4, the crosses show the height of the particle bed after deposition and the circles show the height of the particle bed before deposition.

All of these results confirm the phenomenon of heat dissipation by particulate convection at the cooled inlet zone 35.

Following this observation, the inventors have proposed a change in the apparatus 1 of FIG. 1 that makes it possible to reduce the heat exchange in the inlet zone 35. A diagram of the apparatus 10 according to the invention which responds to this problem is provided in FIG. 5.

Figure 5:
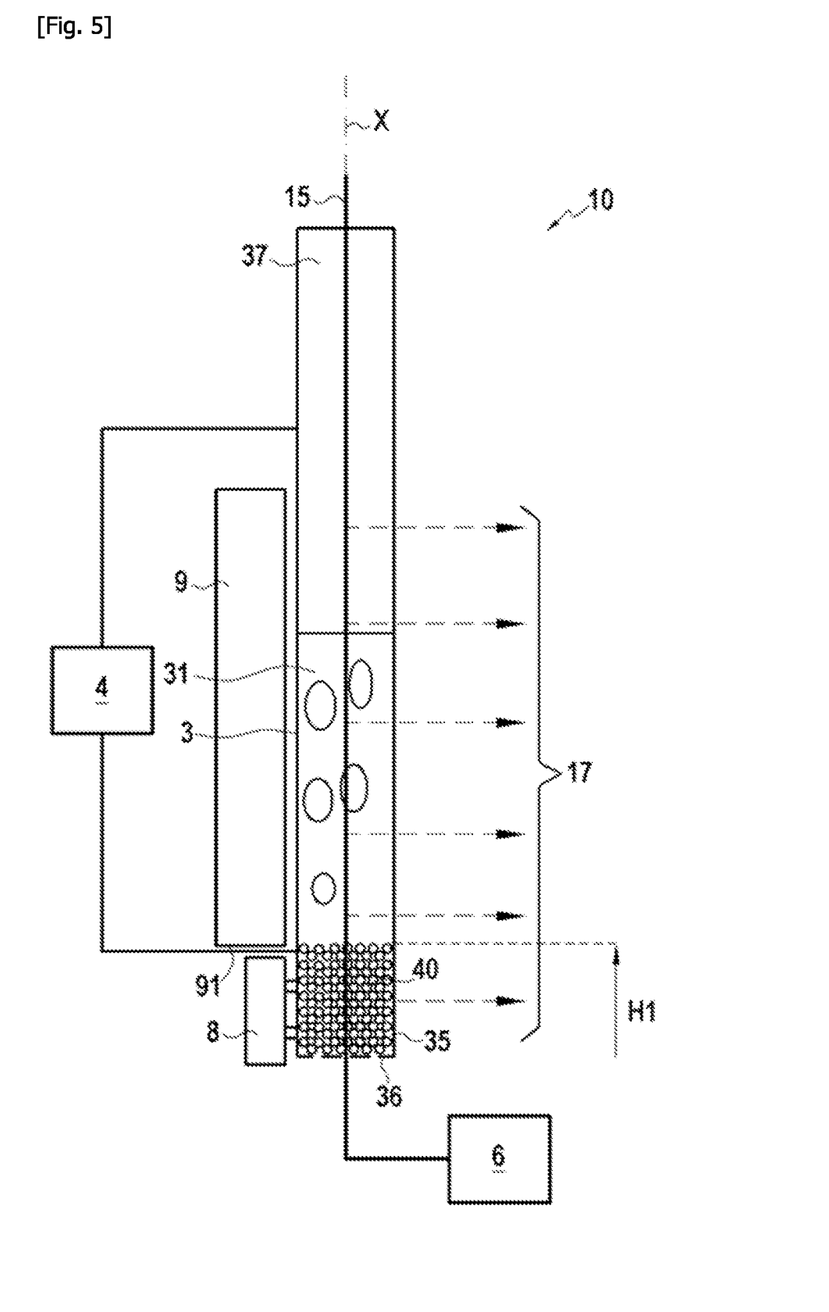
FIG. 5 schematically and partially illustrates an apparatus for implementing a fluidised-bed chemical vapour deposition according to the invention.

The apparatus 10 comprises the same elements as the apparatus 1 and they are referenced in the same way. In order to reduce the heat dissipation in the cooled inlet zone 35, the invention proposes to provide the reactor 3 with a porous thermal insulator 40 which has, as indicated above, a relatively low effective thermal conductivity. The porosity of the insulator 40 allows the gaseous phase to pass through and participates in the reduction of its effective thermal conductivity. The volume pore ratio of the insulator 40 can be between 26% and 48%, for example between 34% and 40%, for example substantially equal to 37%. The porosity of the insulator 40 can have a tortuous shape. The insulator 40 is present between the diffuser 36 and the treatment zone 31. The insulator 40 can be present over more than 50%, or even over at least 75%, or even over substantially all of the height of the inlet zone 35. The insulator 40 can be present over more than 50%, or even over at least 75%, or even over substantially all of the height over which the cooling system 8 extends. The insulator 40 can extend from the diffuser 36 at least to the lower part 91 of the heating system 9 which is present at height H1. The lower part 91 of the heating system 9 corresponds to the end of the heating system 9 located on the side of the inlet zone 35. A person skilled in the art will however ensure that the insulator 40 does not extend too high beyond the lower part 91 of the heating system 9 in order to avoid the insulator 40 being subject to too high a temperature which could lead to a deposition from the gaseous phase, clogging its pores and hindering the circulation of the gaseous phase. Through his general knowledge, a person skilled in the art knows to determine the height over which the insulator 40 must extend so as to obtain the advantage sought. A person skilled in the art will, for example, choose the height of the insulator 40 so as to obtain a maximum reduction in the average temperature of the fluidised bed of 20° C. at the end of 2 hours deposition. As indicated above, the material forming the insulator 40 may or may not be thermally conducting. A poor thermal conducting material can advantageously be used to form the insulator 40, for example a ceramic material such as zirconia. The thermal conductivity at 20° C. of the material forming the insulator 40 can be between 0.15 W·m⁻¹·K⁻¹ and 418 W·m⁻¹·K⁻¹, for example between 0.15 W·m⁻¹·K⁻¹ and 40 W·m⁻¹·K⁻¹, for example between 0.15 W·m⁻¹·K⁻¹ and 4 W·m⁻¹·K⁻¹, for example between 0.15 W·m⁻¹·K⁻¹ and 3 W·m⁻¹·K⁻¹. The insulator 40 can be in the form of a granular bed. In this case, the insulator 40 is formed by a stack of grains. The grains forming the insulator 40 can be stacked in bulk (non-regular stacking). The insulator 40 can be formed of a different material from the particles to be coated. Alternatively, it is possible to use and insulator 40 formed of a partially sintered block, maintaining a sufficiently open porosity to allow the gaseous phase to pass while having the desired effective thermal conductivity.

Of course, a person skilled in the art will take care to choose the insulator 40 so that it remains fixed during passage of the gaseous phase, so that the particles to be coated do not lodge in it pores and so that it does not cause a noticeable pressure drop in the fluidisation gas. A person skilled in the art knows from his general knowledge to select the density of the material forming the insulator 40 and its porosity so as to respond to these conditions. It is possible, for example, to use a granular bed formed of bulk grains having an average diameter d50 less than or equal to 10 mm, for example between 0.5 µm and 10 mm, and a density greater than or equal to 3 g/cm³, for example between 3.2 g/cm³ and 9 g/cm³. In the case of the example of reactor 3 described above, having a diameter of 5 centimetres and a height of 1 metre, it is possible, for example, to use a bulk stack of zirconia beads having an average diameter d50 equal to 1 mm in order to form the insulator 40. As is usual in fluidised-bed chemical vapour deposition methods, care will be taken to obtain a fluidisation phenomenon during the deposition. In order to allow monitoring of the fluidisation, the apparatus 10 comprises a differential pressure sensor 4, enabling evaluation of the pressure drop of the gas passing through the bed. A person skilled in the art can advantageously keep this pressure drop at a value close to (+/−20%) the ratio between the weight of the bed and the cross-section of the reactor 3 in order to guarantee the fluidised state. A person skilled in the art will also take care to have a relative homogeneity of temperature inside the bed. This thermal property, characteristic of fluidised beds operating optimally, is obtained by the presence of bubbles which ensure an excellent agitation of the particles to be coated. Thermocouples 17 enable the isothermal nature of the bed to be controlled. The quality of the fluidisation can therefore be evaluated from the maximum difference of the temperatures displayed by the thermocouples. For example, a person skilled in the art could carry out the deposition with a maximum temperature difference less than or equal to 20° C., for high temperature depositions (greater than 800° C.).

The coating can be obtained by chemical vapour deposition from a gaseous phase. The gaseous phase can have a thermal conductivity at 20° C. less than or equal to 0.04 $W \cdot m^{-1} \cdot K^{-1}$, for example less than or equal to 0.035 $W \cdot m^{-1} \cdot K^{-1}$. The thermal conductivity of the gaseous phase can be between 0.01 $W \cdot m^{-1} \cdot K^{-1}$ and 0.04 $W \cdot m^{-1} \cdot K^{-1}$, for example between 0.01 $W \cdot m^{-1} \cdot K^{-1}$ and 0.035 $W \cdot m^{-1} \cdot K^{-1}$.

After the deposition, particles are obtained comprising a core and a surface coating enrobing the core, this coating being obtained by fluidised bed vapour phase deposition. The particles are referred to as core-shell particles. The particles to be coated can be of any kind, for example made of ceramic material, carbon or metal material. The coating deposited can be of any kind, for example ceramic or carbon or metal, according to the desired application. The dimensions and the shape of the particles can vary according to the desired application. The particles to be coated can belong to Geldart groupings A or B. The coating deposited can be single-layer or multilayer by changing the nature of the precursor between the deposition of the different layers in order to deposit layers of different chemical nature. The particles coated using the method according to the invention can be used in various applications, forming, for example, catalysts or sintering aids.

A test was carried out to coat the porous alumina powder detailed above, by this time using the example of apparatus 10 according to the invention as shown in FIG. 5, the other operating conditions being kept the same.

Figure 6:
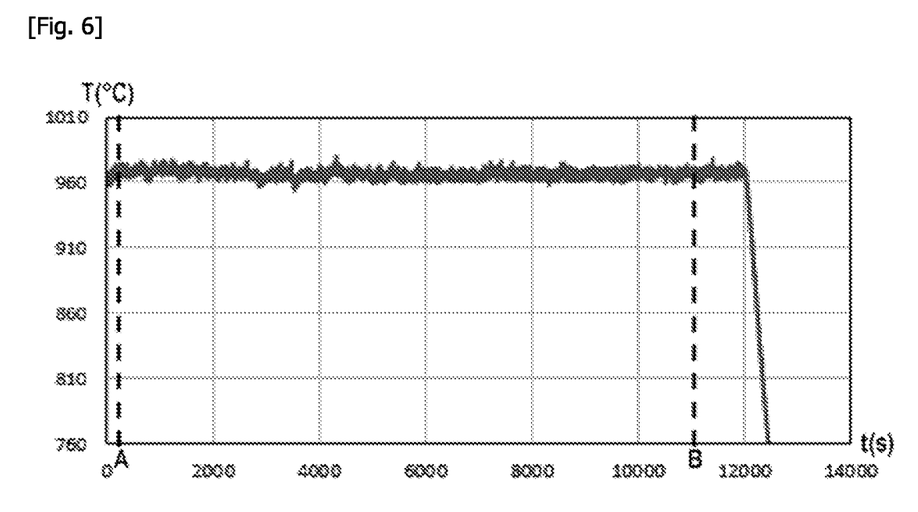
FIG. 6 shows the change over time in the average temperature of the fluidised bed during a deposition carried out using the apparatus of FIG. 5.

The monitoring of the average temperature of the fluidised bed over the course of the deposition is given in FIG. 6. In this figure, the propane injection is represented by the dashed line "A" and the end of propane injection by the dashed line "B". It is observed that the use of the insulator 40 leads to a high thermal stability of the fluidised bed during the deposition operation and to an improved deposition yield. After deposition of the coating, the coated particles are extracted from the reactor 3. When the insulator 40 is in the form of a granular bed, it may be necessary to carry out a step of separating the coated particles from the grains forming the insulator 40. Various methods are possible for this purpose. In particular, sieving can be performed in order to separate the coated particles from the grains due to their different size and shape. In the case where the coated particles are separated from the grains by sieving, grains of average diameter D50 greater than or equal to 0.5 µm can advantageously be chosen. Alternatively, the coated particles or the grains can be magnetically attracted in order to separate them.

The expression "between . . . and . . . " should be understood as including the limits.

The invention claimed is:

1. An apparatus for fluidised-bed chemical vapour deposition, comprising at least:
    a reactor comprising a treatment zone in which the fluidised-bed chemical vapour deposition is intended to be carried out from a gaseous phase, an inlet zone through which the gaseous phase is intended to be introduced into the treatment zone and an outlet zone through which the gaseous phase is intended to be removed from the treatment zone,
    a heating system configured to heat the treatment zone, and
    a cooling system configured to cool the inlet zone,
    wherein the apparatus further comprises a porous thermal insulator present in the inlet zone and configured to be passed through by the gaseous phase, said porous thermal insulator having an effective thermal conductivity at 20° C. less than or equal to 3.5 $W \cdot m^{-1} \cdot K^{-1}$, a porosity of the thermal insulator having a tortuous shape.

2. The apparatus according to claim 1, wherein the porous thermal insulator has an effective thermal conductivity at 20° C. less than or equal to 0.42 $W \cdot m^{-1} \cdot K^{-1}$.

3. The apparatus according to claim 1, wherein the material forming the porous thermal insulator has a thermal conductivity at 20° C. less than or equal to 40 $W \cdot m^{-1} \cdot K^{-1}$.

4. The apparatus according to claim 1, wherein the porous thermal insulator is a granular bed.

5. The apparatus according to claim 1, wherein the volume pore ratio of the porous thermal insulator is greater than 26%.

6. A method for coating particles using an apparatus according to claim 1, comprising at least:
    introducing the gaseous phase into the treatment zone through the inlet zone and the porous thermal insulator,
    depositing a coating on the particles present in the fluidised-bed chemical vapour deposition treatment zone from the gaseous phase introduced, and
    recovering, after depositing of the coating, the coated particles.

7. The method according to claim 6, wherein the gaseous phase has a thermal conductivity at 20° C. less than or equal to 0.04 $W \cdot m^{-1} \cdot K^{-1}$.

8. The method according to claim 6, wherein the porous thermal insulator is a granular bed; and
    after the deposition of the coating, a mixture of coated particles and grains from the granular bed are recovered, and in which the coated particles are separated from said grains.

9. An apparatus for fluidised-bed chemical vapour deposition, comprising at least:
- a reactor comprising a treatment zone in which the fluidised-bed chemical vapour deposition is intended to be carried out from a gaseous phase, an inlet zone through which the gaseous phase is intended to be introduced into the treatment zone and an outlet zone through which the gaseous phase is intended to be removed from the treatment zone,
- a heating system configured to heat the treatment zone, and
- a cooling system configured to cool the inlet zone,
- wherein the apparatus further comprises a porous thermal insulator present in the inlet zone and configured to be passed through by the gaseous phase, said porous thermal insulator having an effective thermal conductivity at 20° C. less than or equal to 3.5 $W \cdot m^{-1} \cdot K^{-1}$, wherein the porous thermal insulator is a granular bed.

\* \* \* \* \*